Nov. 4, 1969 J. P. MIZE ET AL 3,476,991
INVERSION LAYER FIELD EFFECT DEVICE WITH AZIMUTHALLY DEPENDENT CARRIER MOBILITY
Filed Nov. 8, 1967

INVENTORS
JACK P. MIZE
DEREK COLMAN
E. Mickey Hubbard
ATTORNEY

United States Patent Office 3,476,991
Patented Nov. 4, 1969

3,476,991

INVERSION LAYER FIELD EFFECT DEVICE WITH AZIMUTHALLY DEPENDENT CARRIER MOBILITY

Jack P. Mize, Richardson, and Derek Colman, Dallas, Tex., assignors to Texas Instruments Incorporated, Dallas, Tex., a corporation of Delaware Filed Nov. 8, 1967, Ser. No. 681,413
Int. Cl. H01l *11/14*
U.S. Cl. 317—235 13 Claims

ABSTRACT OF THE DISCLOSURE

An integrated circuit in which metal-oxide-semiconductor field effect transistors are formed on a surface disposed parallel to the (110) crystallographic plane of a silicon crystal. The carrier mobility in a thin inversion layer parallel to the (110) plane is azimuthally dependent, and is a maximum in either direction perpendicular to the ($\bar{1}$10) plane and is a minimum in the direction perpendicular to the (001) plane. The integrated circuit includes a driver transistor which is oriented such that current flows normal to the ($\bar{1}$10) plane for maximum carrier mobility, and a load transistor which is oriented such that current flows normal to the (001) plane for minimum carrier mobility. The resulting circuit occupies a minimum area of the surface of the crystal.

This invention relates generally to semiconductor devices, and more particularly, but not by way of limitation, relates to integrated circuits using inversion layer devices such as metal-insulator-semiconductor field effect transistors.

Carrier mobility is one of the more important parameters to be considered when designing integrated circuits using inversion layer devices such as the metal-oxide-semiconductor field effect transistors (MOSFEF). Although it is generally desirable to have a high carrier mobility for most circuit applications, it is desirable for certain applications to have a low carrier mobility. Others have investigated the carrier mobilities in inversion layers on the various crystallographic planes of silicon crystal identified by the well-known Miller indices. As a result of those investigations, it was heretofore believed that the highest electron mobility occurred in inversion layers disposed parallel to the (100) crystallographic plane and that the highest hole mobility occurs in inversion layers disposed parallel to the (111) plane. For this and other reasons, it has been the accepted practice to fabricate most MOS field effect devices on the surface of a silicon crystal oriented parallel to the (111) crystallographic plane.

We have discovered that the greatest carrier mobility in a p-type inversion layer in n-type silicon actually exists in the (110) crystallographic plane, and more particularly exists in the direction perpendicular to the ($\bar{1}$10) crystallographic plane. Further, we have discovered that the carrier mobility in an inversion layer parallel to the (110) plane is azimuthally dependent, and has a minimum value in a direction perpendicular to the (001) crystallographic plane, which is at right angles to the direction of maximum carrier mobility. Although experimental data is not available at this time to absolutely confirm the fact, theoretical analysis performed in the light of this discovery predicts that substantially any semiconductor crystal, such as germanium, the Group III-Group V, the Group II-Group VI semiconductors, and the tertiary combinations of these elements, have crystallographic planes in which two-dimensional conduction of the type existing in an inversion layer have azimuthally dependent values.

Our discovery has far reaching implications and is particularly useful in fabricating field effect transistors having inversion layers where a high carrier mobility is desired, or where the combination of a high carrier mobility and a low carrier mobility is desired in a single integrated circuit, such as in a common inverter comprised of a driver transistor and a load transistor.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figures 1, 2, 3, 4:
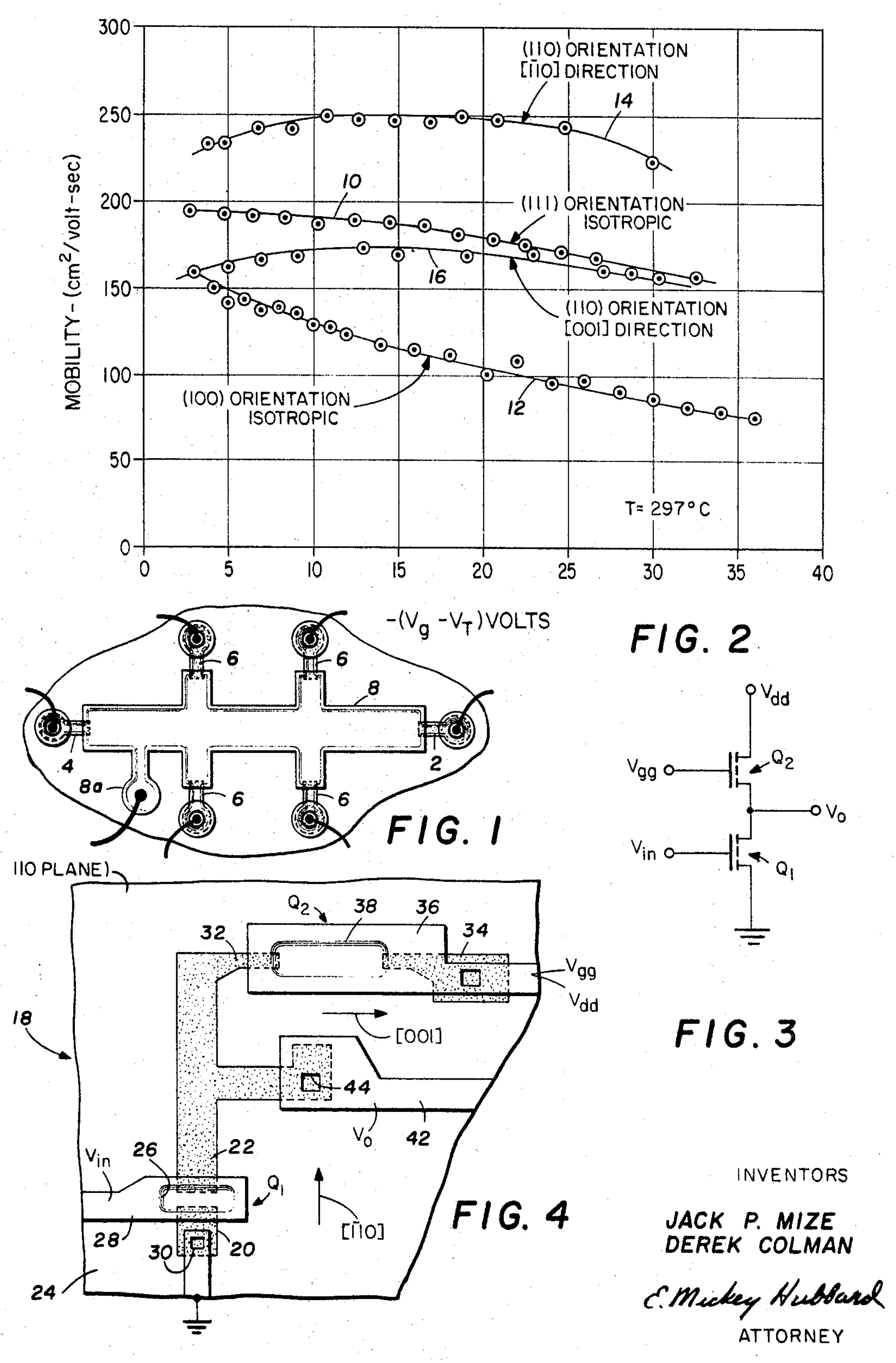
FIGURE 1 is a plan view of a Hall bar device used to collect mobility data.
FIGURE 2 is a graph illustrating the carrier mobility with respect to gate voltage in p-type inversion layers formed parallel to various crystallographic planes in silicon and in various azimuthal directions within the plane.
FIGURE 3 is a schematic circuit diagram of a typical inverter formed by MOS field effect transistors.
FIGURE 4 is a simplified plan view illustrating how the inverter of FIGURE 3 can be geometrically arranged in an integrated circuit in accordance with a specific aspect of the present invention.

The carrier mobility in various azimuthal directions in p-type inversion layers formed at various surfaces of n-type silicon has been determined by fabricating metal-oxide-semiconductor (MOS) transistors in the form of Hall bars on selected surfaces of silicon crystals. The Hall bars were fabricated as shown in FIGURE 1 and comprised diffused boron regions to form the source 2, drain 4 and Hall contact regions 6. The dielectric over the gate region was silicon dioxide thermally grown at 950° C. and doped with phosphorus. A metal gate 8 has the shape illustrated and a gate contact 8*a*. The devices had a width (W) of 0.254 mm. and a length (L) of 2.29 mm. The oxide thickness ($t$) in the area 9 of reduced thickness was nominally 1,000 angstroms. The devices were enhancement mode field effect transistors with threshold voltages $V_T$ varying from three to six volts. The Hall measurements were made using a magnetic field of 5,000 gauss, although it was determined that the mobility measurements were independent of magnetic field strength up to 6,000 gauss. Although the absolute accuracy of the Hall mobility measurements was estimated as ±8%, reproducibility was much better. The devices were fabricated on the (110), (100) and (111) planes of silicon, and in various azimuthal directions on each plane, and Hall mobility measurements made on each.

The measured Hall mobility ($\mu_H$) was then converted to conductivity mobility ($\mu_C$) which is deduced from the conductance ($g_s$) of the Hall bar devices shown in FIGURE 1 by the expression $$g_s = \frac{\mu_C \epsilon_{OX} \epsilon_O}{t} \frac{W}{L} (V_g - V_T - V_d) \quad (1)$$

where $V_g$=gate voltage
$V_T$=threshold voltage
$V_d$=drain voltage
$\epsilon_{OX}\epsilon_O$=dielectric constant of the oxide
$t$=thickness of the oxide It was found that the conductivity mobility $\mu_C$ was 1.25±0.05 times the Hall mobility $\mu_H$ for material having from one to ten ohm-centimeters resistance in the inversion layer formed on the (110), (100), and (111) planes. This value compares favorably with the theoretical value of 1.13 reported by J. N. Zemel, in the Physics Review, 112 (1958), at page 762. Care was taken to insure that the potential difference between source and drain was small compared with the gate voltage above threshold, thus insuring that the perpendicular electrical field in the inversion layer was uniform over the length of the device.

The conductivity carrier mobility derived by this process is indicated in FIGURE 2. The conductivity mobility of the inversion layer of the Hall device disposed parallel to the (111) crystallographic plane is indicated by curve 10, which is applicable regardless of the azimuthal orientation of current flow. The carrier mobility for inversion layers parallel to the (100) crystallographic plane is represented by curve 12, which is also independent of the azimuthal direction of current flow. The carrier mobility in inversion layers disposed parallel to the (110) crystallographic plane are represented by curves 14 and 16. Curve 14 represents the carrier mobility in a direction perpendicular to the ($\bar{1}10$) crystallographic plane, and curve 16 represents the carrier mobility in a direction perpendicular to the (100) crystallographic plane. It will be noted that the current mobility in the [$\bar{1}10$] direction is approximately 40% greater than the carrier mobility perpendicular to the (001) crystallographic plane.

The anisotropy of the experimental data shown in FIGURE 1 can be predicted by accepting Neumann's principle that every physical property of a material will have the same symmetry as the crystallographic form of a material. Using Neumann's classical method of studying the effect of symmetry, the symmetry operators constituting the point group of the crystal are successively applied on the tensor representing the physical property. After each symmetry operation on the tensor, it is demanded that the tensor shall remain invariant. Thus, certain conditions governing the relations between the various components of the tensor describing the physical properties emerge, and arising out of these conditions some of the tensor components vanish leaving a given number of non-vanishing and mutually independent constants for a given physical property of a crystal of a certain symmetry.

The most general form of a two-dimensional resistivity tensor as applied to a surface inversion layer is $$p=\begin{pmatrix}\rho 11 & \rho 12\\ \rho 21 & \rho 22\end{pmatrix} \qquad (2)$$

If there is no anisotropic stress in the inversion layer, the resistivity tensor must contain the symmetry of the crystal in the plane of the layer. For example, silicon is a cubic crystal and so a (100) surface must contain the symmetry of a cross section through the cube in this plane, that is a square. The resistivity tensor for a (100) inversion layer must therefore be invariant to certain reflections and 90° rotational operations. Applying these restrictions to the tensor, one deduces that the resistivity (and hence also the mobility) must be isotropic on this plane. If this procedure is repeated for the (111) plane, it is found that isotropic resistivity is again necessary as a result of the crystal symmetry. On the (110) plane, choosing the [001] direction as the principal axis, it is found that the tensor reduces to $$\begin{pmatrix}\rho 11 & 0\\ 0 & \rho 22\end{pmatrix} \qquad (3)$$

which is not isotropic unless this is required by some consideration other than symmetry.

Therefore, although experimental data only for silicon has been compiled to date, anisotropic resistivity can be predicted using this theoretical procedure and can then be measured using the Hall bar approach previously described in substantially any semiconductor material.

For many MOSFET applications, the highest possible carrier mobility in the inversion layer is desired. For n-type silicon, the current flow in the essentially two-dimensional current path represented by the relatively thin p-type inversion layer, which may be on the order of 100 angstroms thick, should be in the (110) crystallographic plane and in the [$\bar{1}10$] direction.

The azimuthally dependent characteristics of the carrier mobility in semiconductors can be used to advantage in integrated circuits where various circuit components require different carrier mobilities for optimum performance. One example is the fundamental inverter illustrated in FIGURE 2. MOS transistor $Q_1$ is the active drive device, and MOS transistor $Q_2$ is the passive load device. Analysis of the circuit when operated at saturated load resistance results in the expressions:

$$\frac{\mu_2\epsilon\epsilon_o W_2}{2t_{ox}L_2}[(V_{gg}-V_o)-V_T]^2=\frac{\mu_1\epsilon\epsilon_o W_1}{2t_{ox}L^1}[2(V_{in}-V_T)V_o-V_o^2] \qquad (4)$$

$$\text{for } |V_{in}-V_T|\geq|V_o|$$

$$\frac{\mu_2\epsilon\epsilon_o W_2}{2t_{ox}L_2}[(V_{gg}-V_o)-V_T]^2=\frac{\mu_1\epsilon\epsilon_o W_1}{2t_{ox}L^1}V_{in}-V_T)^2 \qquad (5)$$

$$\text{for } |V_{in}-V_T|<|V_o|$$

where $\mu$ is the carrier mobility of the respective devices, $\epsilon\epsilon_o$ is the dielectric constant of the gate oxide, $t_{ox}$ is the thickness of the gate oxide, W is the width of the channel of the respective device, L is the length of the channel of the respective device, and $V_T$ is the threshold voltage.

It is frequently desirable to have the impedance of the load transistor $Q_2$ as high as possible, and the impedance of the drive transistor $Q_1$ as low as possible. Since the mobility values $\mu_1$ and $\mu_2$ were heretofore thought to be equal, the impedance ratios have heretofore been adjusted by selecting the channel width W and the channel length L of the driver and load devices. For example, to achieve high impedance in the channel of the load transistor $Q_2$, the channel length $L_2$ of the device must be lengthened. Conversely, to achieve the desired low impedance for the drive transistor $Q_1$, the channel length $L_1$ is made as short as possible.

In accordance with the present invention, the components of the inverter of FIGURE 2 are laid out as shown in FIGURE 3 on the (110) surface of a slice of n-type silicon 18 so that the driver transistor $Q_1$ has a maximum mobility and the load transistor $Q_2$ has a minimum mobility. Transistor $Q_1$ is formed by diffused source and drain regions 20 and 22. A relatively thick layer 24 of silicon dioxide is formed over the surface of the silicon slice, but has a thin region 26, typically about 1,000 angstroms thick, over the channel between the source and drain regions. A metal film 28 extends over the thin layer of oxide in region 28 to form the metal gate. A metal film 30 is in direct ohmic contact with the diffused source region 20 through an opening 30 in the oxide layer 24. The load transistor $Q_2$ is formed in the same manner by a diffused source region 32, which is a continuation of drain region 22, diffused drain region 34, and metal gate 36 which is disposed over a region 38 of thin oxide. The gate 36 is shorted to the drain region 34 through an opening 40 in the oxide, and $V_{gg}$ and $V_{dd}$ are the same value. The output voltage $V_o$ is then through metal film 42 which is in ohmic contact with the diffused regions 22–32 through an opening 44 in the oxide layer.

The source and drain diffusions 20 and 22 of the driver transistor $Q_1$ are arranged such that current flow through the inverted layer forming the channel is in the [$\bar{1}10$] direction, that is in a direction normal to the ($\bar{1}10$) crystallographic plane. This provides a maximum mobility value for $\mu_2$, as can be seen from the data presented in FIGURE 1. The source and drain diffusions 24 and 26 of the load transistor $Q_2$ are disposed such that current flow through the inversion layer forming the channel is in a direction at right angles to the direction of current flow through the channel of transistor $Q_1$, which is in the [001] direction, i.e., normal to the (001) crystallographic plane, so that the carrier mobility value $\mu_2$ for the load transistor will be a minimum value. As a result of this procedure, the ratio of the impedance of the load transistor to the impedance of the driver transistor can be increased for a given geometric size in order to improve performance, or conversely, the geometric size of the load transistor can be reduced for a given impedance ratio, Thus resulting in a significant saving of area on the integrated circuit.

Although a specific example has been shown which utilizes the azimuthally dependent carrier mobility of a particular plane in a semiconductor, it will be appreciated that the same concept is applicable to any circuit or subcircuit in which it is desirable to use a variable carrier mobility. This design capability is enhanced by the fact that the carrier mobility for the azimuthal directions between the maximum values normal to the ($\bar{1}10$) plane and the minimum values normal to the (001) plane are intermediate values which are dependent upon the particular azimuthal direction. Thus the design engineer can select substantially any carrier mobility between the maximum and minimum merely by the proper geometric orientation of the source and drain diffusions for the device. Also, while the specific embodiment of the concept described herein is a p-type inversion layer formed in n-type silicon, the principle is applicable to any thin layer which behaves essentially as a two-dimensional conduction sheet in any plane of any semiconductor which exhibits azimuthally dependent carrier mobility.

Although preferred embodiments of the invention have been described in detail, it is to be understood that various changes, substitutions, and alterations can be made therein without departing from the spirit and scope of the invention as defined by the appended claims.

What is claimed is:

1. A semiconductor device having an essentially two-dimensional conduction layer disposed substantially parallel to a crystallographic plane of the semiconductor crystal which exhibits azimuthally dependent carrier mobility and a plurality of metal-insulator-semiconductor field effect components on said conduction layer, each component having a conduction path including said layer.

2. The semiconductor device defined in claim 1 wherein the semiconductor is silicon and the conduction layer is disposed substantially on the (110) plane.

3. The semiconductor device defined in claim 2 wherein the current flow of one of said components through its conduction path is substantially perpendicular to the ($\bar{1}10$) crystallographic plane to obtain maximum carrier mobility.

4. The semiconductor device defined in claim 2 wherein the current flow of one of said components through its conduction path is substantially perpendicular to the (001) crystallographic plane to obtain minimum carrier mobility.

5. The semiconductor device defined in claim 1 wherein the current flow of one of said components through its conduction path is in the maximum carrier mobility direction and the current flow of another of said components through its conduction path is in the direction of minimum carrier mobility.

6. The semiconductor device which comprises a slice of semiconductor material having a pair of metal-insulator-semiconductor transistors formed on a surface of the slice disposed parallel to a crystallographic plane which exhibits azimuthally dependent carrier mobility, the transistors being geometrically oriented such that the direction of current flow in one transistor is in a different azimuthal direction than the current flow in the other transistor whereby the effective carrier mobility in each transistor is different.

7. The semiconductor device defined in claim 6 wherein one transistor is a driver and the other transistor is a load, and the driver transistor is oriented such that current flow through the transistor is in the azimuthal direction of greatest carrier mobility and the load transistor is oriented such that current flow through the transistor is in the azimuthal direction of lowest carrier mobility.

8. The semiconductor device defined in claim 7 wherein the semiconductor is silicon and the surface of the slice is parallel to the (110) crystallographic plane.

9. The semiconductor device defined in claim 8 wherein current through the driver transistor is in a direction substantially normal to the ($\bar{1}10$) crystallographic plane and current through the load transistor is in a direction substantially normal to the (001) crystallographic plane.

10. The semiconductor device defined in claim 6 wherein the semiconductor is silicon and the surface of the slice is disposed parallel to the (110) crystallographic plane.

11. An integrated circuit comprising a plurality of metal-insulator-semiconductor transistors formed on the surface of a single semiconductor crystal, the surface being disposed substantially parallel to a crystallographic plane which exhibits azimuthally dependent carrier mobility in a thin inversion layer at the surface.

12. A semiconductor device comprising a metal-insulator-semiconductor transistor having a thin inversion layer formed on the (110) crystallographic plane of a silicon crystal with current flowing through the inversion layer in a direction normal to the ($\bar{1}10$) crystallographic plane.

13. A semiconductor device comprising a metal-insulator-semiconductor transistor having a thin inversion layer formed on the (110) crystallographic plane of a silicon crystal with current flowing through the inversion layer in a direction normal to the (001) crystallographic plane.

References Cited

UNITED STATES PATENTS

| | | | |
|---|---|---|---|
| 2,994,811 | 8/1961 | Senitzky | 317—235 |
| 3,302,078 | 1/1967 | Skellett | 317—235 |
| 3,378,783 | 4/1968 | Gibson | 330—35 |
| 3,407,343 | 10/1968 | Fang | 317—235 |
| 3,410,132 | 11/1968 | Hall | 73—88.5 |
| 3,370,995 | 9/1965 | Lowery et al. | 148—175 |

JOHN W. HUCKERT, Primary Examiner

M. EDLOW, Assistant Examiner

U.S. Cl. X.R.

307—304